United States Patent
Nardi et al.

(10) Patent No.: US 9,988,715 B2
(45) Date of Patent: Jun. 5, 2018

(54) INTERFACE ENGINEERING DURING MGO DEPOSITION FOR MAGNETIC TUNNEL JUNCTIONS

(71) Applicant: Lam Research Corporation, Fremont, CA (US)

(72) Inventors: Katie Lynn Nardi, San Jose, CA (US); Nerissa Sue Draeger, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days. days.

(21) Appl. No.: 14/935,330

(22) Filed: Nov. 6, 2015

(65) Prior Publication Data

US 2017/0130330 A1    May 11, 2017

(51) Int. Cl.
| | |
|---|---|
| *H01L 41/47* | (2013.01) |
| *C01F 5/02* | (2006.01) |
| *G11B 5/31* | (2006.01) |
| *C23C 16/40* | (2006.01) |
| *C23C 16/455* | (2006.01) |
| *H01L 21/00* | (2006.01) |

(52) U.S. Cl.
CPC ...... *C23C 16/403* (2013.01); *C23C 16/45534* (2013.01); *H01L 21/00* (2013.01)

(58) Field of Classification Search
CPC ......... H01L 21/02518; H01L 21/02614; H01L 41/47; C01F 5/02; G11B 5/3169
USPC ............ 428/800, 811.1; 257/421; 360/324.2; 427/226, 229
See application file for complete search history.

(56) References Cited

U.S. PATENT DOCUMENTS

| | | | | |
|---|---|---|---|---|
| 2002/0076837 A1* | 6/2002 | Hujanen | ................ | B82Y 10/00 438/3 |
| 2002/0196591 A1* | 12/2002 | Hujanen | .............. | G11B 5/3109 360/326 |
| 2006/0141702 A1* | 6/2006 | Woo | ........................ | H01L 28/65 438/250 |
| 2007/0148350 A1* | 6/2007 | Rahtu | ..................... | C23C 16/32 427/249.17 |
| 2007/0234949 A1* | 10/2007 | Ahn | ....................... | C23C 16/407 117/88 |
| 2007/0297099 A1* | 12/2007 | Hirata | .................... | B82Y 10/00 360/324.2 |
| 2008/0253039 A1 | 10/2008 | Nagamine et al. | | |

(Continued)

OTHER PUBLICATIONS

B. S. Lim et al, nature materials vol. 2, Nov. 2003, p. 749-754.*

(Continued)

*Primary Examiner* — Tabassom Tadayyon Eslami
(74) *Attorney, Agent, or Firm* — Weaver Austin Villeneuve & Sampson, LLP.

(57) ABSTRACT

Methods of fabricating magnetic devices are described herein. Methods involve exposing a magnetic film, such as a CoFeB film, to a reducing agent before, during, or after depositing a metal oxide film using atomic layer deposition or chemical vapor deposition. Some methods include exposing the magnetic film in cycles involving exposure to a reducing agent, exposure to a magnesium-containing precursor, and exposure to an oxidant. Methods are suitable for depositing a magnesium oxide layer on a CoFeB layer to form part of a magnetic tunnel junction.

9 Claims, 6 Drawing Sheets

(56) References Cited

U.S. PATENT DOCUMENTS

| | | | |
|---|---|---|---|
| 2010/0002336 A1* | 1/2010 | Sun | B82Y 25/00 360/122 |
| 2011/0254114 A1 | 10/2011 | Nagamine et al. | |
| 2013/0143402 A1* | 6/2013 | Chu | H01L 21/02697 438/658 |
| 2014/0054660 A1* | 2/2014 | Suguro | H01L 21/02244 257/288 |

OTHER PUBLICATIONS

Of Taek S. Yang, J. Vac. Sci. Tech. A23(4)2005, p. 1238-1243.*

S. j. Song et al Chem. Mater. 2012, 24, 4675-4685.*

Sung et al., "Vapor Phase Epitaxy of Magnesium Oxide on Silicon Using Methylmagnesium Alkoxides," Korea Research Institute of Chemical Technology, 1 page, Abstract from 15th Intl. Conf. on Chem. Vapor Deposition, available at http://www.electrochem.org/dl/ma/197/symposia/pio1.html, (May 15, 2000).

Huang, et al., "The surface morphology of atomic layer deposited magnesia," J. Mater. Science Letters 12, pp. 1444-1446, (1993).

Hatanpää, et al., "Properties of $[Mg_2(thd)_4]$ as a Precursor for Atomic Layer Deposition of MgO Thin Films and Crystal Structures of $[Mg_2(thd)_4]$ and $[Mg(thd)_2(EtOH)_2]$," Chem. Mater. 11, pp. 1846-1852, (Apr. 30, 1999).

Putkonen, et al., "Surface-controlled growth of magnesium oxide thin films by atomic layer epitaxy," J. Mater. Chem., 9, pp. 2449-2452, (Jul. 13, 1999).

Putkonen, et al., "Enhanced growth rate in atomic layer epitaxy deposition of magnesium oxide thin films," J. Mater. Chem., 10, pp. 1857-1861, (Published on Jun. 29, 2000).

Burton, et al., "Atomic and electronic structure of the CoFeB/MgO interface from first principles," Appl. Phys. Lett. 89, 142507, (Published Oct. 5, 2006).

Read, et al., "X-ray photoemission study of CoFeB/MgO thin film bilayers," Appl. Phys. Lett. 90, 132503, (Published Mar. 27, 2007).

Carta, et al. "CVD of MgO Thin Films from Bis(methylcyclopentadienyl) Magnesium," Chem. Vap. Deposition 13, pp. 185-189, (Jan. 2007).

Burton, et al., "Atomic Layer Deposition of MgO Using Bis(ethylcyclopentadienyl)magnesium and $H_2O$," J. Phys. Chem. C 113, pp. 1939-1946, (Published Jan. 9, 2009).

de Rouffignac, et al., "Atomic Layer Deposition and Characterization of MgO from Magnesium Bis(Di-secbutylacetamidinate) and Water," Arradiance Inc., Samsung, Harvard University; Poster presented at Proceedings of the 9th AVS Atomic Layer Deposition Conference (Jul. 19-22, 2009).

Read, "Magnesium Boron Oxide Tunnel Barriers," Dissertation, Cornell University, (May 2009), 286 pp.

Kurt, et al., "Boron diffusion in magnetic tunnel junctions with MgO (001) barriers and CoFeB electrodes," App. Phys. Lett. 96, 262501, (Published Jun. 28, 2010).

Lu, et al., "Investigation of Thermal Stability of Atomic-Layer-Deposited MgO Thin Films on Si(100) Using X-Ray Photoelectron Spectroscopy," Electrochemical and Solid-State Letters, 13(3), G25-G28, (Published Dec. 17, 2009).

Schreiber, et al., "Enhanced magnetoresistance in naturally oxidized MgO-based magnetic tunnel junctions with ferromagnetic CoFe/CoFeB bilayers," Appl. Phys. Lett. 98, 232506, (Published Jun. 8, 2011).

Schreiber, et al., "Effects of elemental distributions on the behavior of MgO-based magnetic tunnel junctions," J. Appl. Phys. 109, 103909, (Published May 20, 2011).

Mantovan, et al., "Synthesis of magnetic tunnel junctions with full in situ atomic layer and chemical vapor deposition processes," Thin Solid Films 520, pp. 4820-4822, (Aug. 16, 2011).

Wang et al., "Highly conformal magnesium oxide thin films by low-temperature chemical vapor deposition from $Mg(H_3BNMe_2BH_3)_2$ and water," Appl. Phys. Lett. 102, 101605, (published Mar. 15, 2013).

Knisley, et al., "Precursors and chemistry for the atomic layer deposition of metallic first row transition metal films," Coordination Chemistry Reviews 257, pp. 3222-3231, (published Mar. 26, 2013).

Wang, et al., "Nucleation and growth of MgO atomic layer deposition: a real-time spectroscopic ellipsometry study," J. Vac. Sci. Technol. A 31, 06F101, (Published Jul. 26, 2013).

Song, et al., "Investigation of atomic layer deposition of magnesium oxide on a CoFeB layer for three-dimensional magnetic tunneling junctions," J. Alloys and Compounds 588, pp. 716-719, (Published Dec. 6, 2013).

Huo, et al., "Characteristics of copper films produced via atomic layer deposition," J. Mater. Res., vol. 17, No. 9, pp. 2394-2398, (Sep. 2002).

Kalutarage, et al., "Volatile and Thermally Stable Mid to Late Transition Metal Complexes Containing α-Imino Alkoxide Ligands, a New Strongly Reducing Co-Reagent, and Thermal AtomicLayer Deposition of Ni, Co, Fe, and Cr Metal Films," J. Am. Chem. Soc., 135, 12588-12591, and Supporting Information (Published Aug. 15, 2013).

Dey, et al., "Copper reduction and atomic layer deposition by oxidative decomposition of formate by hydrazine," The Royal Society of Chemistry, RSC Adv., 4, pp. 34448-34453, (Published Jul. 29, 2014).

Kalutarage, et al., "Manganese Precursor Selection and the Thermal Atomic Layer Deposition of Copper/Manganese Alloy Films," ECS Transactions, 64 (9), pp. 147-157, (Published 2014).

Sato, et al., "Evidence of a reduction reaction of oxidized iron/cobalt by boron atoms diffused toward naturally oxidized surface of CoFeB layer during annealing," Appl. Phys. Lett. 106, 142407, (Published Apr. 10, 2015).

* cited by examiner

INTERFACE ENGINEERING DURING MGO DEPOSITION FOR MAGNETIC TUNNEL JUNCTIONS

BACKGROUND

Semiconductor fabrication processes include fabrication of stacks including metal oxides adjacent to layers of various materials, including metals and metal alloys. However, techniques for depositing and subsequently etching these materials raise many challenges as devices shrink and fabrication of various types of structures becomes more complex. As a result, other fabrication techniques are of interest.

SUMMARY

Provided herein are methods of processing substrates. One aspect is a method of fabricating a layer for a magnetic device by depositing a metal oxide film on a surface of a magnetic film; and exposing the magnetic film to a reducing agent during the deposition of the metal oxide film to reduce oxide at an interface between the metal oxide film and the magnetic film. In some embodiments, the magnetic device is a magnetic tunnel junction.

The metal oxide film may be deposited to form a part of a magnetic tunnel junction. The metal oxide film may be deposited by chemical vapor deposition. The metal oxide film may be fabricated at a temperature less than about 400° C. The reducing agent may be a direct or remote hydrogen plasma. The reducing agent may be any of hydrogen, ammonia, hydrazines, hydrazides, formalin, borane dimethylamine, metal borohydrides, organic borohydrides, boranes, carbon monoxide, carbon dioxide, and combinations thereof.

In various embodiments, the metal oxide film is deposited by exposing the magnetic film to alternating cycles of a metal precursor and an oxidant. Each deposition cycle may be substantially self-limiting. The magnetic film may be exposed to the reducing agent at least partly when the magnetic film is exposed to the metal precursor. The reducing agent used in a cycle may be different from the reducing agent used in another cycle.

The reducing agent may be any of hydrogen, hydrogen plasma species, ammonia, hydrazines, hydrazides, formalin, borane dimethylamine, metal borohydrides, organic borohydrides, boranes, carbon monoxide, carbon dioxide, and combinations thereof. In some embodiments, the reducing agent is a direct or remote hydrogen plasma.

The metal oxide film may be deposited to form a part of a magnetic tunnel junction. The metal oxide film may be deposited by chemical vapor deposition. The metal oxide film may be fabricated at a temperature less than about 400° C. The metal oxide film may be deposited to a thickness less than about 20 nm. The metal oxide film may be any of magnesium oxide, aluminum oxide, nickel oxide, titanium oxide, tantalum oxide, lanthanum oxide, lanthanum aluminum oxide, strontium oxide, and strontium titanium oxide.

The metal oxide film may be deposited using one or more magnesium-containing precursors such as bis(ethylcyclopentadienyl) magnesium, bis(cyclopentadienyl) magnesium, bis(methylcyclopentadienyl) magnesium, bis(n-propyl-tetramethyl-cyclopentadienyl)magnesium, bis(pentamethylcyclopentadienyl)magnesium, bis(2,2,6,6-tetramethyl-3,5-heptanedionato) magnesium, magnesium β-diketonate, magnesium N,N-dimethylaminodiboronate, magnesium bis(di-secbutylacetamidinate), and combinations thereof. The metal oxide film may be deposited using oxidants such as water, oxygen, oxygen plasma, hydrogen peroxide, ozone, and combinations thereof.

Exposing the magnetic film to the reducing agent further may include exposing the substrate to an organic reagent which may be an alcohol, aldehyde, or carboxylic acid. In some embodiments, the magnetic device with the metal oxide film has a tunnel magnetoresistance of at least about 200%. The magnetic film may be exposed to the reducing agent before any metal oxide is deposited. The magnetic film may be any of a cobalt iron, cobalt iron boron, nickel iron, cobalt palladium, and combinations thereof.

Deposition of the metal oxide film and exposure to the reducing agent may be performed in cycles. The reducing agent may be a direct or remote hydrogen plasma. The reducing agent may be any of hydrogen, ammonia, hydrazines, hydrazides, formalin, borane dimethylamine, metal borohydrides, organic borohydrides, boranes, carbon monoxide, carbon dioxide, and combinations thereof. The reducing agent used in a cycle may be different from the reducing agent used in another cycle. The magnetic device including the metal oxide film may have a tunnel magnetoresistance of at least about 200%.

Exposing the magnetic film to the reducing agent further includes exposing the substrate to an organic reagent such as alcohols, aldehydes, and carboxylic acids.

The magnetic film may be exposed to the reducing agent before any metal oxide is deposited. The metal oxide film may be deposited to a thickness less than about 20 nm. The metal oxide film may be any of magnesium oxide, aluminum oxide, nickel oxide, titanium oxide, tantalum oxide, lanthanum oxide, lanthanum aluminum oxide, strontium oxide and strontium titanium oxide. The magnetic film may be any of a cobalt iron, cobalt iron boron, nickel iron, cobalt palladium, and combinations thereof. The metal oxide film may be deposited using magnesium-containing precursors such as bis(ethylcyclopentadienyl) magnesium, bis(cyclopentadienyl) magnesium, bis(methylcyclopentadienyl) magnesium, bis(n-propyl-tetramethyl-cyclopentadienyl)magnesium, bis(pentamethylcyclopentadienyl)magnesium, bis(2,2,6,6-tetramethyl-3,5-heptanedionato) magnesium, magnesium β-diketonate, magnesium N,N-dimethylaminodiboronate, magnesium bis(di-secbutylacetamidinate), and combinations thereof. The metal oxide film may be deposited using oxidants such as any of water, oxygen, oxygen plasma, hydrogen peroxide, ozone, and combinations thereof.

Another aspect may involve a method of processing substrates by depositing magnesium oxide on a metal film by (i) exposing the metal film to a magnesium-containing precursor; (ii) exposing the metal film to an oxidant; and (iii) exposing the metal film to a reducing agent to reduce the metal film during deposition of the magnesium oxide. In various embodiments, (i)-(iii) are repeated in cycles. Each deposition cycle may be substantially self-limiting. In some embodiments, (iii) is performed every nth cycle, wherein n is an integer greater than or equal to 2.

In various embodiments, (iii) is performed prior to (i)-(ii). The magnesium oxide may be deposited at a temperature less than about 400° C. In various embodiments, the reducing agent is any of hydrogen, ammonia, hydrazines, hydrazides, formalin, borane dimethylamine, metal borohydrides, organic borohydrides, boranes, carbon monoxide, carbon dioxide, and combinations thereof. The reducing agent used in a cycle may be different from the reducing agent used in another cycle.

The magnesium oxide may be deposited to a thickness less than about 20 nm. The magnesium oxide may be deposited to form a magnetic device having a tunnel magnetoresistance of at least about 200%. In some embodiments, (iii) further includes exposing the metal film to an organic reagent such as alcohols, aldehydes, and carboxylic acids.

The metal film may be any of a cobalt iron, cobalt iron boron, nickel iron, cobalt palladium, and combinations thereof. The magnesium oxide is deposited using magnesium-containing precursors such as bis(ethylcyclopentadienyl) magnesium, bis(cyclopentadienyl) magnesium, bis(methylcyclopentadienyl) magnesium, bis(n-propyl-tetramethyl-cyclopentadienyl)magnesium, bis (pentamethylcyclopentadienyl)magnesium, bis(2,2,6,6-tetramethyl-3,5-heptanedionato) magnesium, magnesium β-diketonate, magnesium N,N-dimethylaminodiboronate, magnesium bis(di-secbutylacetamidinate), and combinations thereof.

The oxidant may be any of water, oxygen, oxygen plasma, hydrogen peroxide, ozone, and combinations thereof.

Another aspect involves a method of fabricating magnetic devices by (a) exposing a metal film having a first standard electrode potential to a metal precursor having a second standard electrode potential; (b) exposing the metal film to an oxidant to form a metal oxide film; and (c) exposing the metal film to a reducing agent having a standard electrode potential between the first standard electrode potential and the second standard electrode potential.

In various embodiments, (a)-(c) are repeated in deposition cycles. In some embodiments, (c) is performed every nth cycle, wherein n is an integer greater than or equal to 2. Each deposition cycle may be substantially self-limiting. The reducing agent used in a cycle may be different from the reducing agent used in another cycle.

The reducing agent may be any of hydrogen, hydrogen plasma species, ammonia, hydrazines, hydrazides, formalin, borane dimethylamine, metal borohydrides, organic borohydrides, boranes, carbon monoxide, carbon dioxide, and combinations thereof. The reducing agent may be a direct or remote hydrogen plasma.

The metal oxide film may be deposited to form a part of a magnetic tunnel junction. The metal oxide film may be fabricated at a temperature less than about 400° C.

The magnetic device including the metal oxide film has a tunnel magnetoresistance of at least about 200%. The metal oxide film may be deposited to a thickness less than about 20 nm. The metal oxide film may be any of magnesium oxide, aluminum oxide, nickel oxide, titanium oxide, tantalum oxide, lanthanum oxide, lanthanum aluminum oxide, strontium oxide and strontium titanium oxide. The metal film may be any of a cobalt iron, cobalt iron boron, nickel iron, cobalt palladium, and combinations thereof.

The metal oxide film may be deposited using one or more magnesium-containing precursors such as bis(ethylcyclopentadienyl) magnesium, bis(cyclopentadienyl) magnesium, bis(methylcyclopentadienyl) magnesium, bis(n-propyl-tetramethyl-cyclopentadienyl)magnesium, bis(pentamethylcyclopentadienyl)magnesium, bis(2,2,6,6-tetramethyl-3,5-heptanedionato) magnesium, magnesium β-diketonate, magnesium N,N-dimethylaminodiboronate, magnesium bis (di-secbutylacetamidinate), and combinations thereof.

The metal oxide film may be deposited using oxidants such as water, oxygen, oxygen plasma, hydrogen peroxide, ozone, and combinations thereof.

Another aspect involves an apparatus for fabricating magnetic devices, the apparatus including: (a) at least one process chamber including a pedestal for holding a substrate wafer with a magnetic film on it; (b) at least one outlet for coupling to a vacuum; (c) one or more process gas inlets coupled to one or more metal-containing precursor sources, one or more oxidizing agents, and one or more reducing agents; (d) a controller for controlling operations in the apparatus, including machine-readable instructions for: (i) introducing a reducing agent to the at least one process chamber; (ii) introducing a magnesium-containing precursor to the at least one process chamber; and (iii) introducing an oxidant to the at least one process chamber to form a magnesium oxide film on a metal substrate.

In some embodiments, the apparatus also includes (e) a plasma generator.

The controller may also include machine-readable instructions for: (iv) repeating (ii) and (iii) in alternating pulses and performing (i) every n cycles of performing (ii) and (iii). The controller may also include machine-readable instructions for: (iv) igniting a plasma during (i); and (v) repeating (ii) and (iii) in alternating pulses and performing (i) every n cycles of performing (ii) and (iii).

In some embodiments, the controller may also include machine-readable instructions for: (iv) igniting a plasma during (iii); and (v) repeating (ii) and (iii) in alternating pulses and performing (i) every n cycles of performing (ii) and (iii).

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication may involve fabrication of magnetic devices, such as magnetic random access memory (MRAM) devices. These devices may include a plurality of thin metal layers or films and a tunnel dielectric layer that together form a magnetic tunnel junction. A magnetic tunnel junction (MTJ) is composed of a thin tunnel dielectric layer between two magnetic multilayers, one of which is the "fixed layer" and the other is the "free layer." Spin-polarized electrons pass through the tunnel dielectric by the process of quantum tunneling. This can serve as a basis for magnetic-based memory or logic devices.

Spin-transfer torque is an effect in which the orientation of a magnetic layer in a MTJ can be modified using a spin-polarized current. Charge carriers (e.g., electrons) have a property known as spin, which is a small quantity of angular momentum intrinsic to the carrier. An electrical current is generally unpolarized (50% spin-up and 50% spin-down electrons). By passing a current through a thick magnetic layer (usually called the "fixed layer"), a spin polarized current, with more electrons of either spin can be produced. If this spin-polarized current is directed into a second, thinner magnetic layer (the "free layer"), angular momentum can be transferred to this layer, changing its magnetic orientation. This effect can be used to excite oscillations or even flip the orientation of the magnet.

Spin-transfer torque can be used to flip the active elements in magnetic random-access memory. Spin-transfer torque magnetic random-access memory (STT-RAM or STT-MRAM) has the advantages of lower power consumption and better scalability over conventional magnetoresistive random-access memory (MRAM) which uses magnetic fields to flip the active elements. Spin-transfer torque technology has the potential to make possible MRAM devices combining low current requirements and reduced cost. Ralph, D. C.; Stiles, M. D. (April 2008). "Spin transfer torques". Journal of Magnetism and Magnetic Materials 320 (7): 1190-1216.

Magnetic tunnel junctions can also be used for spintronic logic gates as a possible replacement for metal-oxide-semiconductor field-effect transistors (MOSFETs) used in current complementary metal-oxide-semiconductor (CMOS) devices. The MTJ can be used with other magnetic materials and device elements to form a logic switch.

Figure 1:
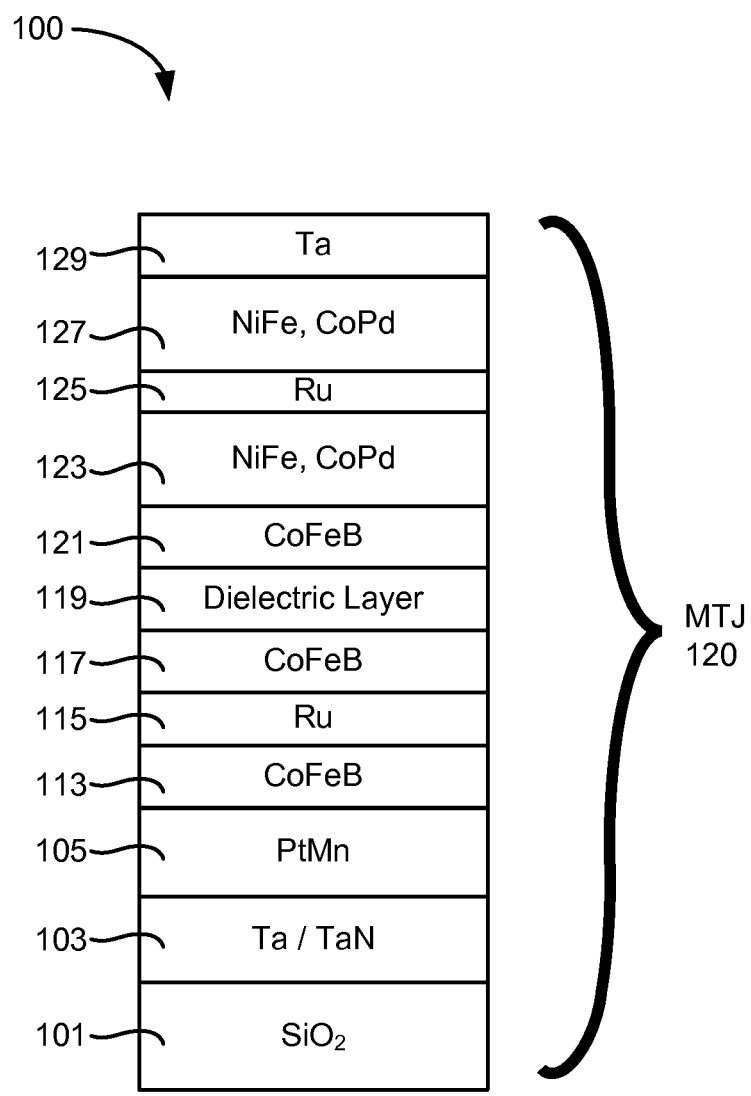
FIG. 1 is a schematic illustration of an example substrate.

An example MTJ stack is provided in FIG. 1. FIG. 1 shows a stack 100 including a silicon oxide etch stop layer 101, a tantalum nitride barrier layer 103, a platinum manganese alloy layer 105, a first CoFeB layer 113, a ruthenium metal layer 115, a second CoFeB layer 117, a dielectric layer 119, a third CoFeB layer 121, a NiFe or CoPd layer 123, a ruthenium layer 125, a second NiFe or CoPd layer 127, and a tantalum layer 129. The MTJ stack 120 is composed of all of the layers as shown in the Figure. In some embodiments, the fixed layer includes layers 101, 103, 105, 113, 115, and 117. In some embodiments, the fixed layer includes layers 103, 105, 113, 115, and 117. In various embodiments, the fixed layer includes the lower magnetic layers 101 through 117. The tunnel dielectric separates it from the free layer which may include the upper magnetic layers 121 through 129. In some embodiments, the free layer includes layers 129, 127, 125, 123, and 121. In some embodiments, the free layer includes layers 123 and 121. A dielectric layer 119 in a magnetic device may have a thickness of less than about 20 nm, or less than about 2 nm.

Note that although specific materials are shown in the Figure, other suitable materials may be present in such a stack. The layer 121 and layer 117 may include metals and/or metal alloys, such as cobalt iron, cobalt iron boron, nickel iron, cobalt palladium, or combinations thereof. The dielectric layer 119 may be a metal oxide layer, such as magnesium oxide, aluminum oxide, nickel oxide, titanium oxide, tantalum oxide, titanium oxide, lanthanum oxide, lanthanum aluminum oxide, strontium oxide, and strontium titanium oxide.

Although FIG. 1 shows the fixed layer on the bottom and the free layer on the top, other orientations have been demonstrated by those with skill in the art. For example, the free layer may be on the bottom and the fixed layer may be on top. In other examples, the MTJ may be oriented horizontally instead of vertically.

One of the key challenges yet to be overcome in the high density scaling of STT-MRAM is in the fabrication of the layers of the MRAM stack. In particular, the dielectric layer (such as dielectric layer 119 depicted in FIG. 1) is adjacent to two metal-containing layers (the fixed and free layers), and conventional methods of fabricating the MTJ encountered various challenges. For example, the dielectric layer is typically a very thin metal oxide layer (to allow the tunneling to occur) but conventional techniques of depositing the metal oxide dielectric layer may also oxidize the underlying metals in the free or fixed layers. Since the interface between the dielectric layer and the underlying metal layer, typically CoFeB, contribute to the efficiency of tunneling in the magnetic device, oxidation of the underlying or other metal films in the fixed or free layer may render the device inefficient, unreliable, or inoperable.

One conventional technique for fabricating magnetic tunnel junction materials is physical vapor deposition (PVD). In a PVD approach, the multi-layer film stack is deposited as blanket films, and the films are subsequently etched to form the three-dimensional MTJ pillar. However the etch processes for some of these magnetic metals are unknown or very challenging and often damaging to the MTJ layers.

Provided herein are methods of fabricating a tunnel dielectric for a magnetic device on a metal-containing layer. Disclosed embodiments include deposition of a thin tunnel oxide by atomic layer deposition (ALD) or chemical vapor deposition (CVD) with a deposition precursor, reducing agent, and an oxidant.

ALD is a technique that deposits thin layers of material using sequential and primarily self-limiting reactions. Typically, an ALD cycle includes operations to deliver and adsorb at least one reactant to the substrate surface, and then to react the adsorbed reactant with one or more reactants to form the partial layer of film. As an example, a metal oxide deposition cycle may include the following operations: (i) delivering or adsorbing a metal-containing precursor, (ii) purging or evacuating of excess metal-containing precursor from the chamber, (iii) delivering of a second reactant or oxidant, and (iv) purging or evacuating of excess reactant or oxidant from the chamber. The reactant or oxidant may include species from a downstream or direct plasma. In some embodiments, adsorbing a first reactant to the substrate surface saturates at least 95% or about 100% or 100% of the substrate surface. Other types of films may be deposited using pulses of various precursors and co-reactants.

Unlike most CVD techniques, ALD processes use sequential and primarily self-limiting deposition reactions to deposit films on a layer-by-layer basis. In one example of an ALD process, a substrate surface that includes a population of active surface sites is exposed to a gas phase distribution of a first precursor, such as a metal-containing precursor, in a dose provided to a chamber housing a substrate. Molecules of this first precursor are adsorbed onto the substrate surface, including chemisorbed species and/or physisorbed molecules of the first precursor. After a first precursor dose, the chamber is then evacuated or purged to remove most or all of first precursor remaining in gas phase so that mostly or only the adsorbed species remain. In some implementations, the chamber may not be fully evacuated or purged. For example, the reactor may be evacuated or purged such that the partial pressure of the first precursor in gas phase is sufficiently low to mitigate a reaction. A second reactant, such as an oxidant, is introduced to the chamber so that some of these molecules react with the first precursor adsorbed on the surface. In some processes, the second reactant reacts immediately with the adsorbed first precursor. In other embodiments, the second reactant reacts only after a source of activation is applied temporally. The chamber may then be evacuated or purged again to remove unbound second reactant molecules. As described above, in some embodiments the chamber may not be completely evacuated or purged. Additional ALD cycles may be used to build film thickness.

In certain embodiments, an ALD first precursor dose partially saturates the substrate surface sites. In some embodiments, the dose phase of an ALD cycle concludes before the precursor evenly or fully saturates the surface. Typically, the precursor flow is turned off or diverted at this point, and only purge gas flows. By operating in this sub-saturation regime, the ALD process reduces the cycle time and increases throughput. Examples of ALD processes operating in the sub-saturation regime are provided in U.S. patent application Ser. No. 14/061,587, now U.S. Pat. No. 9,355,839 filed Oct. 23, 2013, titled "SUB-SATURATED ATOMIC LAYER DEPOSITION AND CONFORMAL FILM DEPOSITION," which is incorporated herein by reference in its entirety.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, now abandoned filed Apr. 11, 2011, and titled "SILICON NITRIDE FILMS AND METHODS," which are herein incorporated by reference in their entireties.

Advantages of using ALD to deposit metal oxide layers in magnetic devices include precise control of thin films, formation of smooth and conformal films. Nonetheless, in various embodiments, metal oxide layers may be deposited by CVD. In CVD, the substrate is exposed to the metal-containing precursor and reactant, such as an oxidant, simultaneously (e.g., the metal-containing precursor and oxidant are present together in a chamber housing the substrate). Although various embodiments described herein involve deposition of metal oxide layers using ALD, it will be understood that such layers may also be deposited by CVD.

Disclosed embodiments also include a reducing operation to prevent and/or reduce oxidation of the underlying films while depositing the metal oxide. For example, if magnesium oxide is being deposited on a CoFeB film, the CoFeB film may be periodically exposed to a reducing agent while magnesium oxide is being deposited to reduce any cobalt oxide, iron oxide, or boron oxide from the surface of the substrate and thereby maintain the integrity of the CoFeB/MgO interface in a magnetic device. This embodiment may also prevent or reduce oxidation along the exposed sidewall of the magnetic tunnel junction during metal oxide deposition. Disclosed embodiments are particularly suitable for depositing high tunnel magnetoresistance dielectrics, such as metal oxides having a tunnel magnetoresistance of at least about 200%.

Figure 2A:
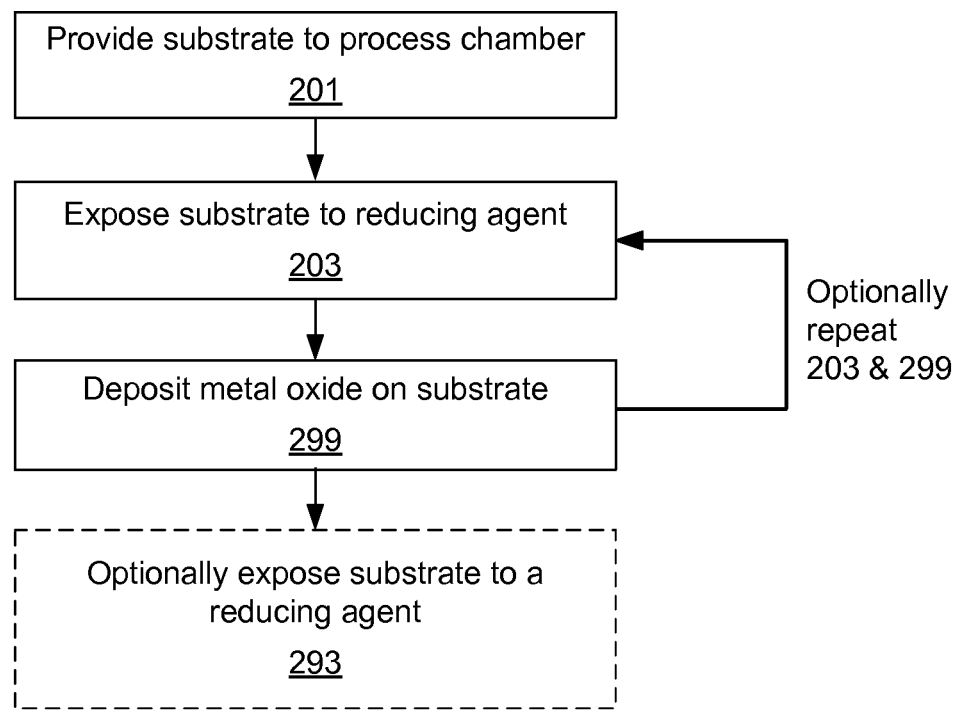
FIGS. 2A and 2B are process flow diagrams depicting operations of methods performed in accordance with disclosed embodiments.

FIG. 2A provides a process flow diagram for performing operations in accordance with certain disclosed embodiments. Although examples provided herein describe disclosed embodiments in the context of depositing magnesium oxide films, it should be understood that methods may be used to deposit any metal oxide films or tunnel oxide films, such as aluminum oxide, nickel oxide, titanium oxide, tantalum oxide, titanium oxide, lanthanum oxide, lanthanum aluminum oxide, strontium oxide, or strontium titanium oxide.

In operation 201, a substrate is provided to a process chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. In various embodiments, the substrate is patterned. A patterned substrate may have "features" such as pillars, poles, trenches, via or contact holes, which may be characterized by one or more of narrow and/or re-entrant openings, constrictions within the feature, and high aspect ratios. The feature(s) may be formed in one or more of the above described layers. One example of a feature is a pillar or pole in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the patterned substrate may include a variety of topography across the substrate. In some embodiments, partially or fully fabricated logic and/or memory devices may be present on the substrate. In various embodiments, the substrate may include layers of metals, dielectric material, and semiconductor material suitable for forming a magnetic device. In some embodiments, the magnetic device is an MRAM. For example, some substrates may include one or more layers of material depicted in FIG. 1, such as an MRAM design in which a memory element includes an MTJ. In other embodiments, the magnetic device is a magnetic or spintronic logic device which includes an MTJ. An MTJ memory element includes two electrodes separated by a thin tunnel barrier. The two electrodes may be ferromagnetic thin film layers, which may be substantially circular, elliptical, square or rounded square shaped. In some embodiments, an MTJ memory element includes additional magnetic layers. For example, an MTJ memory element may further include a pair of ferromagnetic layers sandwiching a thin metal layer—these ferromagnetic layers may be referred to as a synthetic antiferromagnet and an antiferromagnetic layer. Further description of shapes and designs of example MRAM memory elements that may be fabricated on substrates using methods described herein is provided in "Cell Shape and Patterning Considerations for Magnetic Random Access Memory (MRAM) Fabrication" by Ditizio, Robert et al., published in "Semiconductor Manufacturing Magazine" pp. 90-96.

In various embodiments, the surface of the substrate is a metal layer. The metal layer may include cobalt, iron, nickel, palladium, platinum, ruthenium, boron, and combinations thereof. In various embodiments, the substrate is cobalt iron, cobalt iron boron, nickel iron, cobalt palladium, or combinations thereof. In various embodiments, the metal layer includes one or more layers that are prone to oxidation. The metal film may be present on the substrate as a multi-layer of blanket films or it may already be patterned as a three-dimensional stack of patterned films.

Various disclosed embodiments may be performed at a pressure between about 0.1 Torr and about 20 Torr, or between about 0.5 Torr and about 5 Torr. In many embodiments, the methods disclosed may be performed at a substrate temperature less than about 450° C., or between about 50° C. and about 400° C., such as about 100° C. to 300° C. In such embodiments, the pedestal may be set to a temperature of less than about 400° C. to control the substrate temperature.

In operations 203 and 299, an inert gas may be flowed. In various embodiments, part or all of the inert gas is used as a carrier gas for the precursor and/or reactants. Example carrier gases include argon, nitrogen, and helium. In some embodiments, the inert gas is used as a purge gas in some operations. In some embodiments, the carrier gas, with or without the reactants, is diverted in some operations. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

In operation 203, the substrate is exposed to a reducing agent. The reducing agent may be a reducing agent having a standard electrode potential between that of magnesium and the metal(s) on the surface of the substrate, such as iron or cobalt. While the standard electrode potential will vary under actual operating conditions, this may be a useful estimate. This may reduce any metal oxides formed from oxidation of the metal underlayer, while minimizing any reduction of a metal oxide deposited in subsequent operations. In operation 203, the reducing agent may reduce any oxidation of the metal underlayer formed due to air exposure prior to deposition of the metal oxide. For example, the standard electrode potential for magnesium, if depositing magnesium oxide in subsequent operations, is:

  Eqn. 1

The standard electrode potential for iron is:

  Eqn. 2

The standard electrode potential for cobalt is:

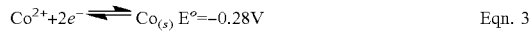  Eqn. 3

For depositing a magnesium oxide layer on a metal substrate, such as CoFeB, a reducing agent may be selected such that the reducing agent has a standard electrode potential between −2.70V and −0.89V, or between −2.70V and −0.28V. For example, hydrogen may be used as a reducing agent, as hydrogen has a standard electrode potential as follows:

  Eqn. 4

The reducing agent may be a vapor, gas, or a plasma. In some embodiments, the reducing agent is a gas. Examples of suitable reducing agent gases include hydrogen, ammonia, hydrazines, hydrazides, formalin, borane dimethylamine, metal borohydrides, organic borohydrides, boranes, carbon monoxide, carbon dioxide, and combinations thereof. Example hydrazines include methyl hydrazine, ethyl hydrazine, and dimethyl hydrazine. The reducing agents may be mixed with or delivered simultaneously with an inert gas, as discussed above.

In various embodiments, the reducing agent may include species from a plasma of one of the reducing gases, such as a hydrogen plasma. In some embodiments, the plasma is generated in the processing chamber, such as with a direct plasma. In other embodiments, the plasma is generated remote to the processing chamber, such as with a downstream plasma source. For example, the plasma may be formed directly above the substrate surface in the chamber. The in-situ plasma may be ignited at a power per substrate area between about 0.05 W/cm² and about 2.5 W/cm² for 300 mm wafers. For example, the power may range from about 150 W to about 6000 W, or from about 600 W to about 6000 W, or from about 800 W to about 4000 W, for a chamber processing 300 mm wafers. For example, plasmas may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species and ions that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasma processes may be formed by one or more suitable methods other than capacitive coupling of an RF field to a gas. In some embodiments, the plasma is a remote plasma, such that a second reactant is ignited in a remote plasma generator upstream of the chamber, then delivered to the chamber where the substrate is housed. In other embodiments, the plasma is generated by applying a radio frequency (RF) field to a gas using one or more inductively-coupled coils wrapped around the process chamber or coiled in the process chamber hardware.

In some embodiments, operation 203 includes exposing the substrate to the reducing agent and exposing the substrate to an organic reagent. For example, in some embodiments, the reducing agent may be introduced with an organic reagent. Organic reagents include alcohols, aldehydes, and carboxylic acids. Example organic reagents include methanol, ethanol, formic acid, acetic acid, propionic acid, formaldehyde, and acetaldehyde.

The substrate may be exposed to the reducing agent for a duration sufficient to reduce and/or prepare the surface of the underlying film for subsequent operations. In various embodiments, the duration of exposure to the reducing agent may be between about 0.01 and about 60 seconds.

In operation 299, metal oxide is deposited on the substrate. In various embodiments, metal oxide is deposited by CVD. In various embodiments, operation 299 may involve deposition of a metal oxide by ALD. An example of depositing metal oxide by ALD is further described below with respect to FIG. 2B.

In various embodiments, operation 203 is not performed until some metal oxide is deposited on the substrate in operation 299. In some embodiments, operation 299 is performed prior to operation 203.

Operations 203 and 299 may be repeated in various cycles to deposit a desired thickness of metal oxide film on the substrate. Any suitable number of deposition cycles may be included in a process to deposit a metal oxide. In some embodiments, operation 203 may or may not be performed in every deposition cycle. For example, operation 299 may be repeated, while operation 203 is performed every n times that operation 299 is repeated, where n is an integer greater than 1. In some embodiments, operation 203 is performed prior to depositing any metal oxide on a substrate. In some embodiments, the reducing agent used in repeated cycles of operations 203 and 299 may be different for each cycle, or for any number of cycles. In some embodiments, the process may end with operation 299 while in others it may end with operation 203. In operation 293, the substrate may be optionally exposed to the reducing agent again. Any of the reducing agents used in operation 203 may be used in operation 293. In some embodiments, the reducing agent used in operation 293 is different from the reducing agent used in operation 203. In some embodiments, the reducing agent used in operation 293 is the same as the reducing agent used in operation 203. In various embodiments, the chamber may be evacuated or purged with a purge gas before or after performing any of operations 203, 299, and 293. Example purge gases include argon, nitrogen, and helium.

Figure 2B:
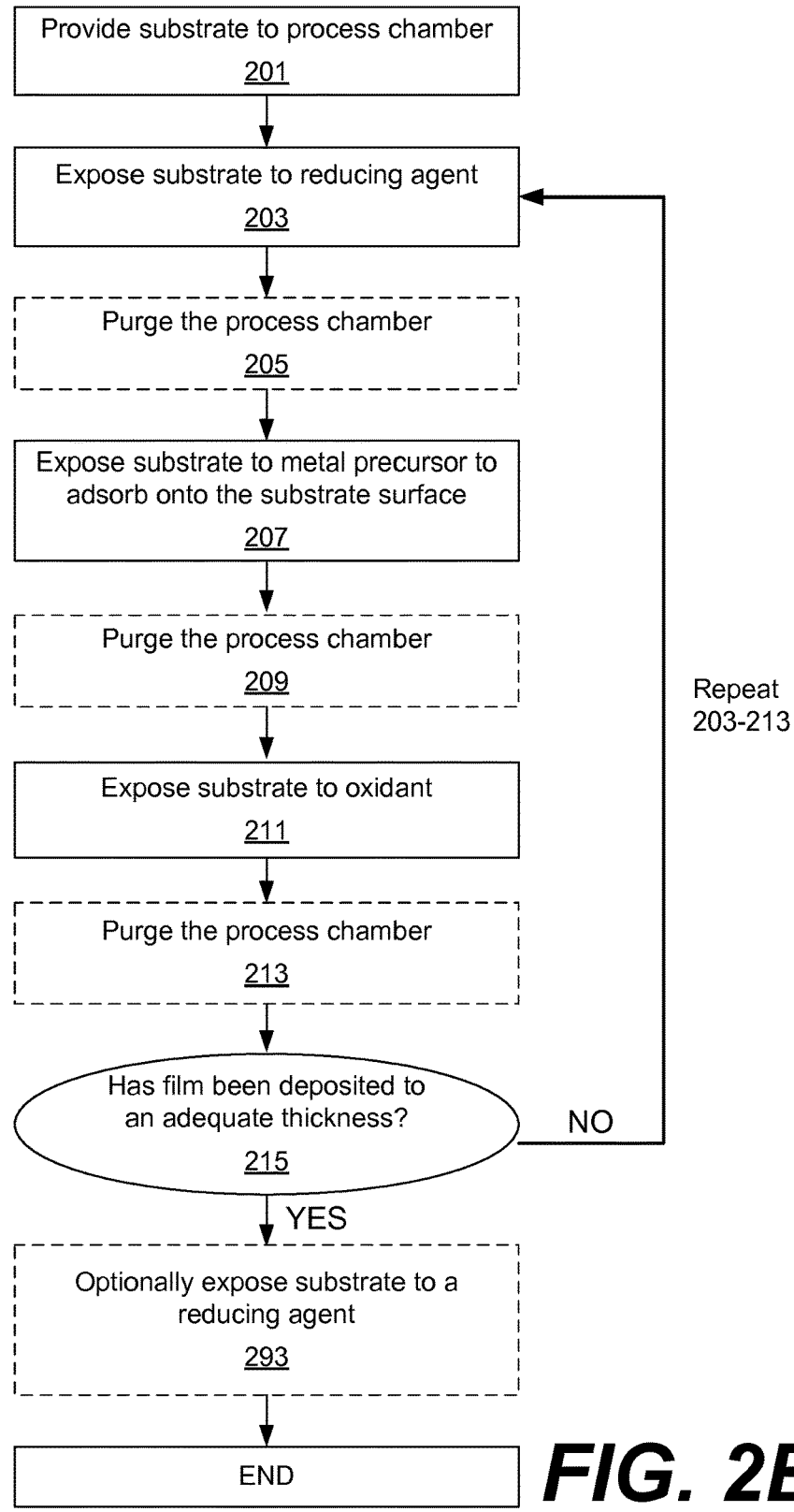

FIG. 2B provides a process flow diagram of operations performed in accordance with certain disclosed embodiments. FIG. 2B provides an example of performing a method in accordance with the operations of FIG. 2A, whereby operation 299 of FIG. 2A is expanded to show one example of depositing metal oxide on a substrate in operations 207-215 of FIG. 2B. Operations 201 and 203 depicted in FIG. 2B may correspond to operations 201 and 203 of FIG. 2A. Any of the above-described embodiments for FIG. 2A with respect to operations 201 and 203 may be used. Operation 293 in FIG. 2B may correspond to operation 293 of FIG. 2A.

In operation 205, the chamber is optionally evacuated or purged to remove any excess reducing agent or reduced byproducts from the process chamber. Example purge gases include argon, nitrogen, and helium. In some embodiments, operation 205 may include one or more evacuation subphases for evacuating the process chamber. Alternatively, it will be appreciated that operation 205 may be omitted in some embodiments. Operation 205 may have any suitable duration, such as between about 0 seconds and about 60 seconds, for example about 0.2 seconds.

In operation 207, the substrate is exposed to a metal precursor for a duration sufficient to adsorb the metal precursor onto the underlying film surface, via either physisorption, or chemisorption. Although examples described herein use a magnesium-containing precursor as a first precursor, it will be understood that the first precursor may be any suitable precursor for depositing metal oxide or tunnel oxide films on a magnetic film. The duration of operation 207 depends on a variety of factors, including the type of metal-containing precursor used. For example, some metal-containing precursors may be more susceptible to adsorbing onto the substrate than others. The duration may also depend on the type of film surface the metal precursor is being adsorbed onto. In some ALD embodiments, the metal precursor dose partially or fully saturates the surface sites. In some embodiments, the metal precursor may react with the surface sites. In some embodiments, the metal precursor is flowed into the chamber continuously during operation 207, with or without a carrier gas. In other embodiments, the metal precursor is introduced to the chamber and contained there during a soak time without continuous flow.

Operation 207 may be part of an ALD cycle in some embodiments. As discussed above, generally an ALD cycle is the minimum set of operations used to perform a surface deposition reaction one time. In some embodiments, the result of one cycle is production of at least a partial magnesium oxide film monolayer on a substrate surface. The cycle may include certain ancillary operations such as purging one or more of the reactants and/or byproducts and/or treating the partial film as deposited. Generally, a cycle contains one instance of a unique sequence of operations. As discussed above, generally a cycle is the minimum set of operations used to perform a surface deposition reaction one time. The result of one cycle is production of at least a partial film monolayer, e.g., a partial magnesium oxide film layer, on a substrate surface.

During operation 207, the substrate is exposed to the metal precursor such that the metal precursor is adsorbed onto the substrate surface to form an adsorbed layer. As described elsewhere herein, various embodiments involve depositing a metal oxide film using substantially self-limiting cycles. In a substantially self-limiting cycle, the metal precursor may not adsorb to 100% of the surface sites. For example, in some embodiments, a magnesium-containing precursor adsorbs onto the substrate surface in a self-limiting manner such that once the surface is saturated with the magnesium-containing precursor, little or no additional magnesium-containing precursor will be adsorbed on the substrate surface. For example, magnesium-containing precursors may be adsorbed onto about 60% of the active surface sites. In various embodiments, when the metal precursor is flowed to the chamber, the metal precursor adsorbs onto active sites on the surface of the underlying film, forming at least a partial monolayer of the metal precursor on the surface. In various embodiments, this layer may be less than a monolayer, and may have a thickness between about 0.2 Å and about 5 Å. Methods provided herein may be performed at a substrate temperature less than about 450° C., or between about 50° C. and about 400° C., such as about 100° C. to 300° C. Operation 207 may be performed at a pressure between about 0.1 Torr and about 20 Torr, or between about 0.5 Torr and about 5 Torr. The ALD cycle including operation 207 may be performed at a constant temperature and pressure, or the temperature or pressure may vary between operation 207 and other operations.

Magnesium-containing precursors suitable for use in accordance with disclosed embodiments include bis(ethylcyclopentadienyl) magnesium, bis(cyclopentadienyl) magnesium, bis(methylcyclopentadienyl) magnesium, bis(n-propyl-tetramethyl-cyclopentadienyl)magnesium, bis (pentamethylcyclopentadienyl)magnesium, bis(2,2,6,6-tetramethyl-3,5-heptanedionato) magnesium, magnesium β-diketonate, magnesium N,N-dimethylaminodiboronate, magnesium bis(di-secbutylacetamidinate), and combinations thereof.

In operation 209, the chamber is optionally evacuated or purged to remove excess metal-containing precursor (e.g., magnesium-containing precursor) in gas phase that did not adsorb onto the surface of the substrate. Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, and helium. In some embodiments, operation 209 may include one or more evacuation subphases for evacuating the process chamber. Alternatively, it will be appreciated that operation 209 may be omitted in some embodiments. Operation 209 may have any suitable duration, such as between about 0 seconds and about 60 seconds, for example about 0.1 seconds. In some embodiments, increasing a flow rate of a one or more purge gases may decrease the duration of operation 209. For example, a purge gas flow rate may be adjusted according to various reactant thermodynamic characteristics and/or geometric characteristics of the process chamber and/or process chamber plumbing for modifying the duration of operation 209. In one non-limiting example, the duration of a purge phase may be adjusted by modulating purge gas flow rate. This may reduce deposition cycle time, which may improve process throughput. After a purge, the magnesium-containing precursors remain adsorbed onto the substrate surface. These embodiments of purge operation 209 also apply to the other purge steps in the ALD cycle, such as operations 205 and 213.

In operation 211, the substrate is exposed to a second reactant, such as an oxidant. In various embodiments, the oxidant is an oxygen-containing reactant used to form at least a partial metal oxide monolayer, such as a magnesium oxide monolayer, on the surface of the underlying film. An oxygen-containing reactant is a reactant or mixture of reactants that includes at least one oxygen atom. Example oxidants include water, oxygen, hydrogen peroxide, ozone, carbon monoxide, carbon dioxide, and combinations thereof.

In some embodiments, the oxidant comprises species from a plasma generated from one of the above-described gases and possibly the addition of other gases such as hydrogen, helium, argon, or nitrogen. In some embodiments, the plasma is a remote plasma, generated in a remote plasma generator upstream of the chamber. In various embodiments, the plasma is an in-situ plasma, such that the plasma is formed directly above the substrate surface in the chamber. The plasma may be generated using any of the conditions described above with respect to igniting a plasma during operation 203 of FIG. 2A. The plasma conditions, including frequency and power, may depend on the type of oxidant selected as well as the metal precursor (e.g., magnesium-containing precursor) used in operation 207. The plasma may activate the reaction between the metal precursor and the oxidant to form a metal oxide on the surface of the substrate.

In operation 213, the chamber is optionally evacuated or purged to remove any excess oxidant or reaction byproducts from the chamber. After the chamber is purged, at least a partial monolayer of metal oxide (such as magnesium oxide) remains on the underlying metal film on the substrate. Operation 213 may be performed per any of the conditions described above with respect to operation 209, including duration and example chemistries of purge gases.

In operation 215, it is determined whether the desired thickness of film has been deposited. If not, operations 203-213 are repeated in cycles to deposit a desired thickness of metal oxide film on the substrate. Any suitable number of deposition cycles may be included in an ALD process to deposit a desired film thickness of a metal oxide. For example, in some embodiments, operations 203-213 may be repeated to deposit a metal oxide to a thickness less than about 20 nm or less than about 1.5 nm. In some embodiments, operation 203 may or may not be performed in every deposition cycle. In some embodiments, operation 203 is performed every n cycles of performing operations 207-213, where n is an integer greater than and including 2. For example, the substrate may be exposed to the reducing agent in operation 203 every 2nd ALD cycle, or every 3rd ALD cycle, 4th ALD cycle, etc.

In some embodiments, operation 215 may be performed after performing operation 203 where operation 203 is performed after performing operations 205-213. In some embodiments, operation 203 is performed prior to depositing any metal oxide on a substrate. In some embodiments, the reducing agent used in repeated cycles of operations 203-213 may be different for each cycle, or for any number of cycles. In one embodiment, a first reducing gas may be used for the initial operation 203 but then a second reducing gas may be used for repeated cycles of operation 203 after performing operations 205-213.

In operation 293, the substrate may be optionally exposed to the reducing agent again. Any of the reducing agents used in operation 203 may be used in operation 293. In some embodiments, the reducing agent used in operation 293 is different from the reducing agent used in operation 203. In some embodiments, the reducing agent used in operation 293 is the same as the reducing agent used in operation 203.

In some embodiments, operation 203 may be performed during either operation 207 or 211 or both. In some embodiments, this is performed such that pulses of reducing agent and/or metal precursor or oxidant are temporally separated. For example, in some embodiments, operation 207 may include exposing the substrate to the metal precursor and a reducing agent in alternating, temporally separated pulses. Likewise, in some embodiments, operation 211 may include exposing the substrate to the metal precursor and exposing the substrate to a reducing agent in alternating, temporally separated pulses.

In various embodiments, the chamber may be purged with a purge gas before or after performing any of operations 203, 215, 299, and 293. Example purge gases include argon, nitrogen, and helium. In some embodiments, operations 203 and 207 are performed simultaneously. For example, in some embodiments, a deposition cycle may include exposing the substrate to both a metal precursor and a reducing agent substantially simultaneously, purging the process chamber, exposing the substrate to an oxidant, and purging the process chamber. Substantially simultaneously may be defined as both flowing both the metal precursor and reducing agent where exposure to the metal precursor and reducing agent is simultaneous for at least about 50% or at least about 65% of the dose time. In some embodiments, the exposures during operation 203 and 207 may overlap such that a substrate is exposed to the reducing agent at least partly when the substrate is also exposed to a metal precursor. In some embodiments, exposures during operation 211 and either of operation 203 may overlap such that the substrate is exposed to the reducing agent at least partly when the substrate is also exposed to an oxidant.

Although FIG. 2B depicts an example of performing disclosed embodiments by depositing a metal oxide by ALD, in various embodiments, a metal oxide may be deposited using a combination of ALD and CVD. For example, for every n cycles of ALD, the substrate may be exposed to a reducing agent then simultaneously exposed to a metal precursor and an oxidant to deposit metal oxide by CVD, where n is any integer equal to or greater than 1.

Although FIG. 2B depicts no additional operations, in some embodiments, after deposition of the metal oxide layer, it may be desirable to deposit another film on top of the metal oxide layer prior to exposing the film to air. This is because the metal oxide film could potentially absorb oxygen, water vapor, nitrogen, or carbon dioxide during air exposure. In one example, a magnetic film including a free layer, such as CoFeB, may be deposited on top of the metal oxide film. In another example, a sacrificial capping film may be deposited on the metal oxide to allow the substrate to be transferred to a different apparatus prior to processing the rest of the magnetic device.

Figure 2C:
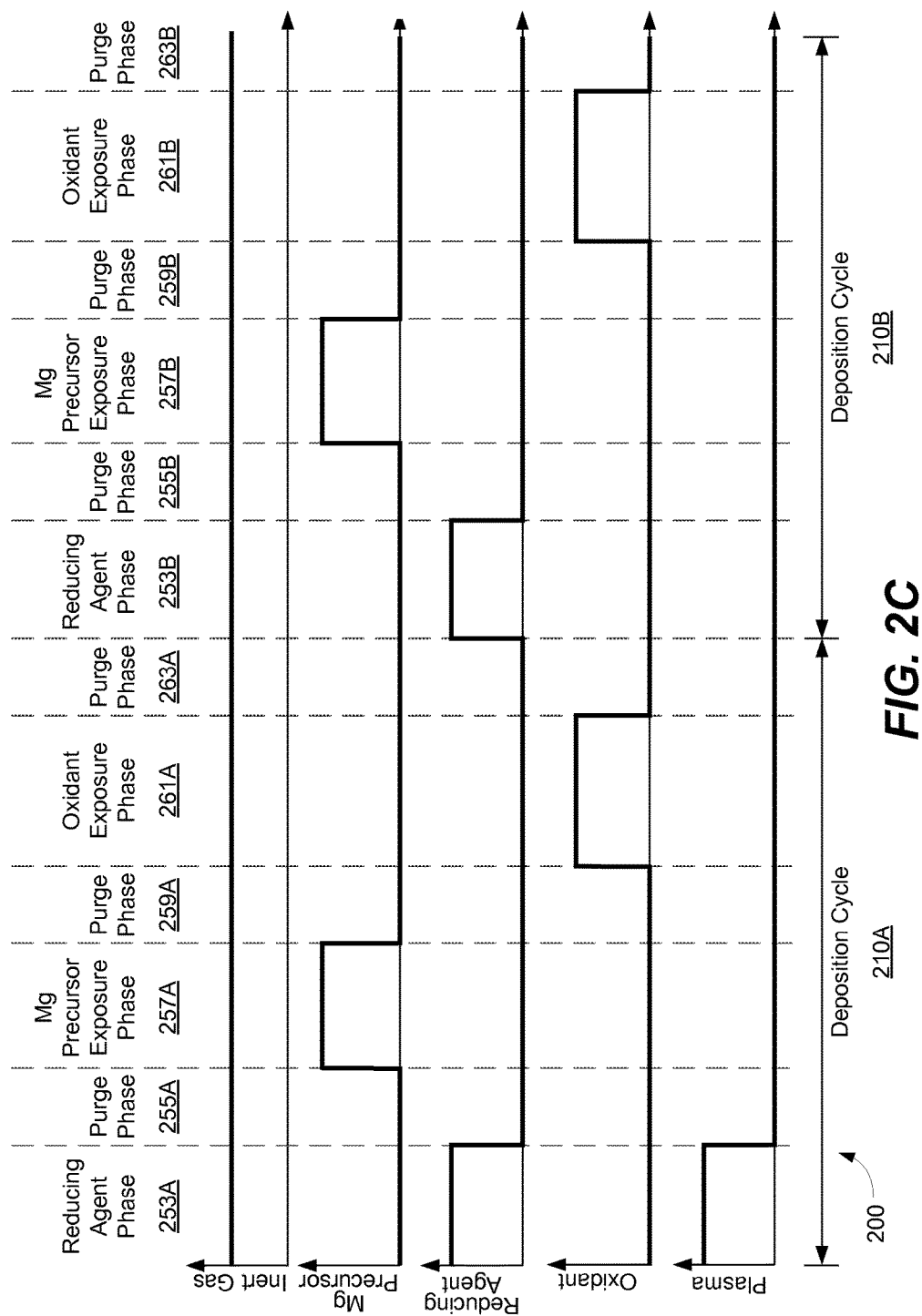
FIG. 2C is a timing sequence diagram showing an example of cycles in a method in accordance with disclosed embodiments.

FIG. 2C is a timing sequence diagram of example pulses in accordance with certain disclosed embodiments. FIG. 2C shows phases in an example deposition process 200, for various process parameters, such as carrier or purge inert gas flow, magnesium-containing precursor flow (depicted as magnesium precursor flow in FIG. 2C), reducing agent flow, oxidant flow, and plasma. In this example, magnesium oxide is deposited on a substrate by first exposing the substrate to a reducing agent such as hydrogen plasma, exposing the substrate to a magnesium-containing precursor, exposing the substrate to an oxidant such as water vapor, exposing it to a reducing agent without a plasma, and purging with an inert gas such as nitrogen between exposures in various cycles.

The lines in FIG. 2C indicate when the flow or plasma is present in the chamber, accordingly. Example process parameters include, but are not limited to, flow rates for inert and process gases, plasma power and frequency, substrate temperature, and process chamber pressure. Two deposition cycles 210A and 210B are depicted. Each deposition cycle includes various phases. For example, deposition cycle 210A includes a reducing agent phase 253A, a purge phase 255A (which may be optional), a magnesium precursor exposure phase 257A, a purge phase 259A (which may be optional), an oxidant exposure phase 261A, and a purge phase 263A (which may be optional). Likewise, deposition cycle 210B includes a reducing agent phase 253B, a purge phase 255B, a magnesium precursor exposure phase 257B, another purge phase 259B, an oxidant exposure phase 261B, and a purge phase 263B. As shown, in example process 200, an inert gas is flowed throughout the deposition cycles 210A and 210B. In various embodiments, the inert gas is used as a carrier gas or as a purge gas. In some embodiments, the carrier gas may be different than the purge gas. In some embodiments, an inert gas is only flowed during purge phases (e.g., 255A, 259A, 263A, 255B, 259B, and 263B). An inert gas may be any of those described above with respect to FIGS. 2A and 2B. Although this example shows a constant flow of inert gas, that may not be the case for all embodiments. In some embodiments, there may be higher inert gas flow during one or both reactant exposure phases due to additional carrier gas flow. In some embodiments, there may be higher inert gas flow during the purge phases to reduce the amount of time necessary to purge the chamber.

In reducing agent phase 253A, a reducing agent is flowed into the chamber with no magnesium-containing precursor or oxidant flow, while a plasma is ignited and an inert gas is flowed. This phase may correspond to operation 203 of FIGS. 2A and 2B. In purge phase 255A, which may correspond to operation 205 of FIG. 2B, an inert gas is flowed while the magnesium-containing precursor flow, reducing agent flow, oxidant flow, and plasma are not present. In magnesium-containing precursor exposure phase 257A, the magnesium-containing precursor and carrier gas are flowing into the chamber while the reducing agent, oxidant, and plasma are not present. This may correspond to operation 207 of FIG. 2B. In purge phase 259A, the inert gas is flowing into the chamber, while the magnesium-containing precursor flow, reducing agent flow, oxidant flow, and plasma voltage and/or power are not present. This may correspond to operation 209 of FIG. 2B. In oxidant exposure phase 261A, the inert gas and oxidant are flowing into the chamber while the magnesium-containing precursor flow, reducing agent flow, and plasma are not present. Note that in some embodiments, depending on the oxidant chosen and the type of metal oxide being deposited and the type of film the metal oxide is deposited on, the plasma may be turned on during this phase. This phase may correspond to operation 211 of FIG. 2B. Returning to FIG. 2C, in purge phase 263A, the inert gas is flowing into the chamber, while the magnesium-containing precursor flow, reducing agent flow, oxidant flow, and plasma are not present. In any of these phases, the gases that are not present in the chamber may be turned off or they may be on but flowing into a divert line that bypasses the chamber. Note that as shown in FIG. 2C, these phases may then be repeated in deposition cycle 210B upon determining in operation 215 of FIG. 2B that the film has not been deposited to an adequate thickness.

Apparatus

Any suitable chamber or apparatus may be used to perform disclosed embodiments. Example apparatuses include Vector products, a Concept-1 Altus™, a Concept 2 Altus™, a Concept-2 Altus-S™, Concept 3 Altus™ deposition system, and Altus Max™ from Lam Research Corp. of Fremont, Calif., or any of a variety of other commercially available atomic layer deposition (ALD), pulsed deposition layer (PDL), or chemical vapor deposition (CVD) tools.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, now abandoned filed Apr. 11, 2011, and titled "SILICON NITRIDE FILMS AND METHODS"; and U.S. Pat. No. 8,993,460, filed Jan. 10, 2013, and titled "APPARATUSES AND METHODS FOR DEPOSITING SIC/SICN FILMS VIA CROSS-METATHESIS REACTIONS WITH ORGANOMETALLIC CO-REACTANTS," which are incorporated by reference herein in their entireties. Further examples include U.S. Pat. No. 6,905,543, filed Jun. 19, 2002, and titled "METHODS OF FORMING TUNGSTEN NUCLEATION LAYER"; U.S. patent application Ser. No. 14/703,732 U.S. Pat. No. 9,595,470 filed May 4, 2015, entitled "METHODS OF PREPARING TUNGSTEN AND TUNGSTEN NITRIDE THIN FILMS USING TUNGSTEN CHLORIDE PRECURSOR" and U.S. patent application Ser. No. 14/320,245, U.S. Pat. No. 9,899,234 filed on Jun. 30, 2014 entitled "LINER AND BARRIER APPLICATIONS FOR SUBTRACTIVE METAL INTEGRATION," which are incorporated by reference for the purpose of describing example apparatuses. Other examples include U.S. Pat. No. 7,737,035, filed Oct. 3, 2006, and titled "DUAL SEAL DEPOSITION PROCESS CHAMBER AND PROCESS"; and U.S. Pat. No. 6,902,620, filed Jun. 7, 2005, and titled "ATOMIC LAYER DEPOSITION SYSTEMS AND METHODS," which are incorporated by reference herein in their entireties.

Figure 3:
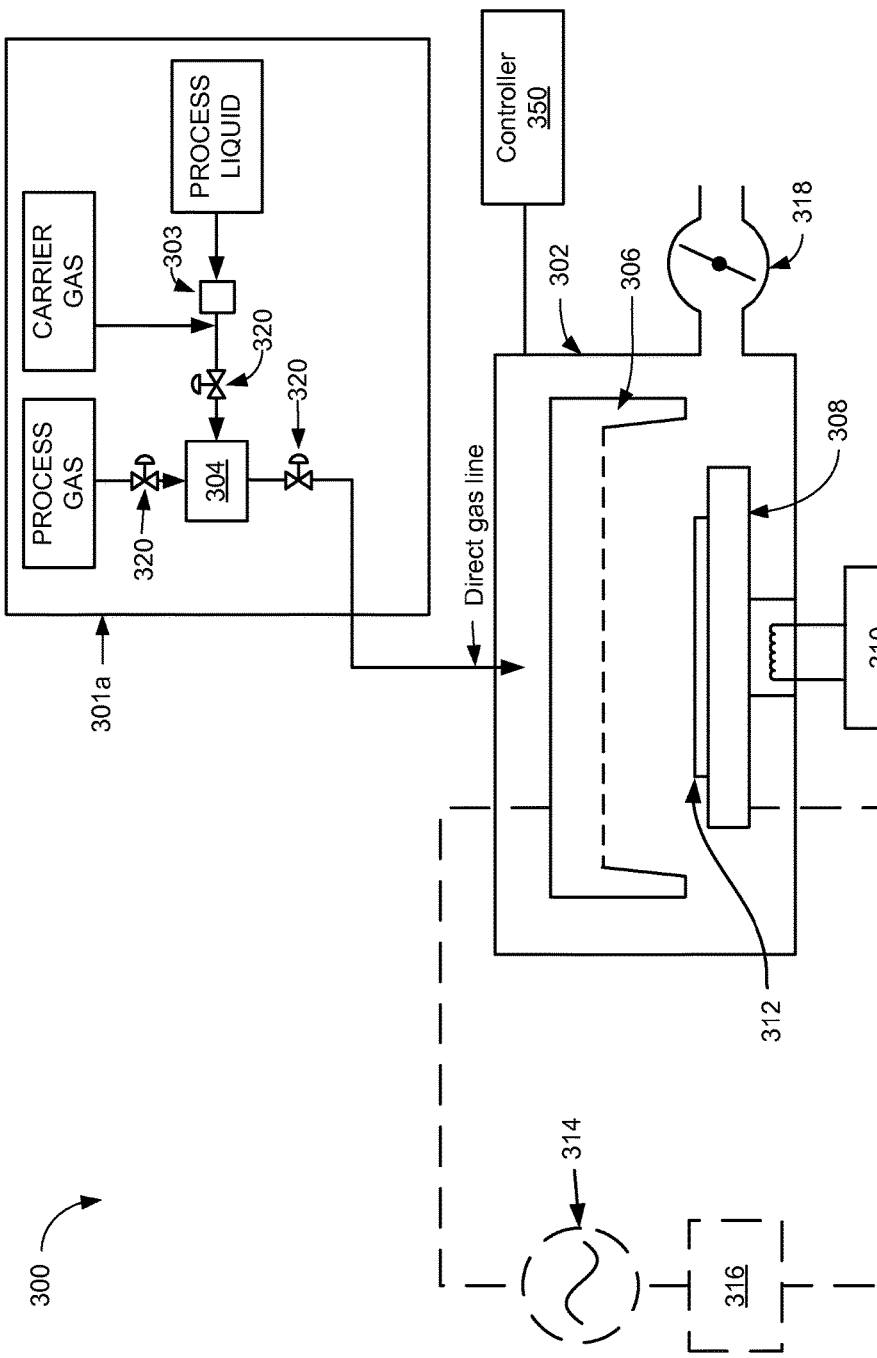
FIG. 3 is a schematic diagram of an example process chamber for performing disclosed embodiments.
Figure 4:
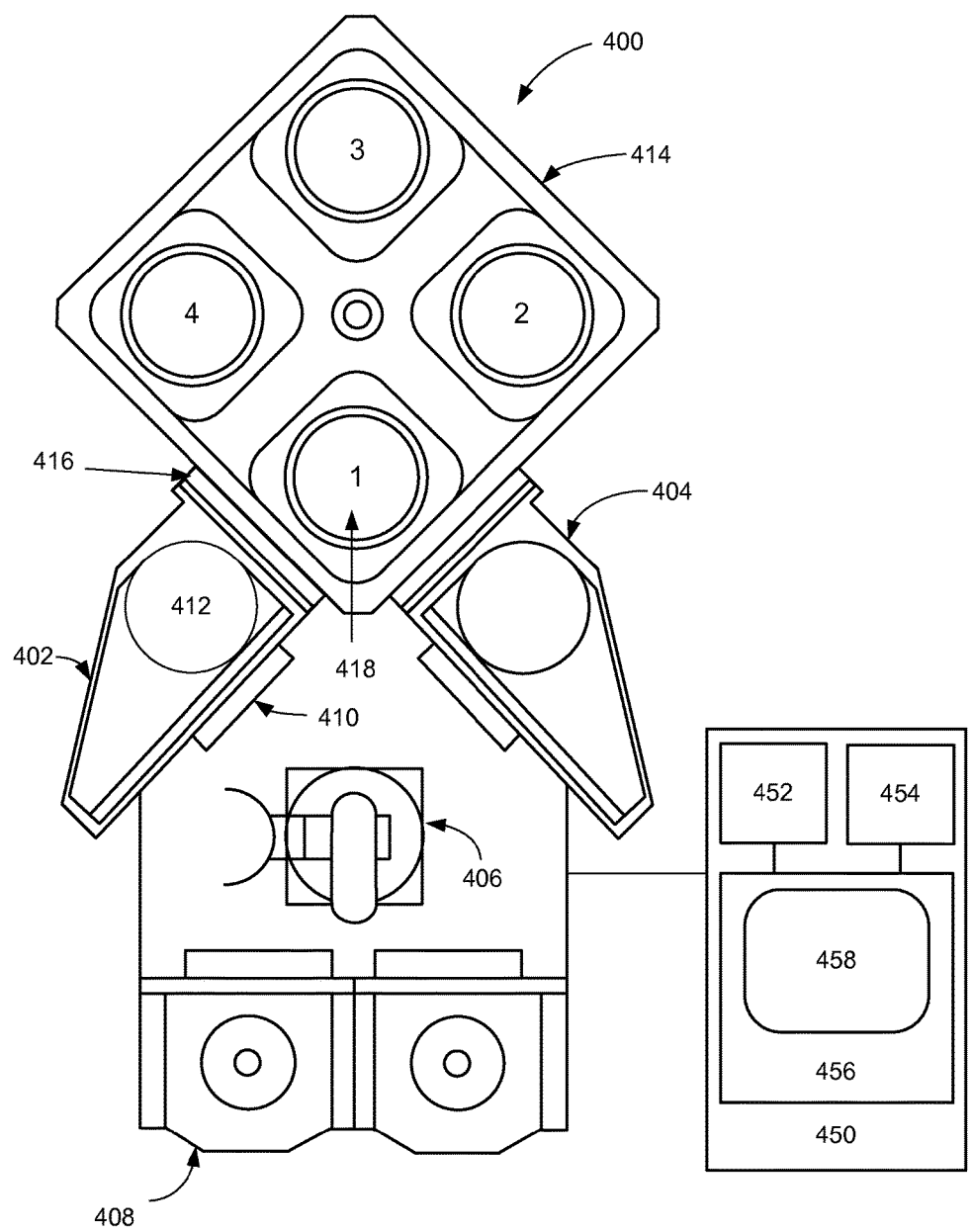
FIG. 4 is a schematic diagram of an example process apparatus for performing disclosed embodiments.

FIG. 3 provides one example of a chamber suitable for performing disclosed embodiments. FIG. 4 provides one example of a tool suitable for performing disclosed embodiments. FIG. 3 depicts a schematic illustration of an example embodiment of an atomic layer deposition (ALD) process station 300 having a process chamber body 302 for maintaining a low-pressure environment. Although FIG. 3 includes an optional RF power supply 314 for generating a plasma, in some embodiments a remote plasma generator may be used. In some embodiments, a plasma is not used in disclosed embodiments. FIG. 3 is provided as an example of one type of chamber that may be used for performing disclosed embodiments.

A plurality of ALD process stations 300 may be included in a common low pressure process tool environment. For example, FIG. 4 depicts an embodiment of a multi-station processing tool 400. In some embodiments, one or more hardware parameters of ALD process station 300, including those discussed in detail below, may be adjusted programmatically by one or more computer controllers 350.

ALD process station 300 fluidly communicates with reactant delivery system 301a for delivering process gases to a distribution showerhead 306. Reactant delivery system 301a may include a mixing vessel 304 for blending and/or conditioning process gases, such as a reducing agent gas, or a metal precursor gas such as a magnesium-containing precursor gas, or an oxidant gas, for delivery to showerhead 306. One or more mixing vessel valves 320 may control introduction of process gases to mixing vessel 304.

As an example, the embodiment of FIG. 3 includes a vaporization point 303 for vaporizing liquid reactant to be supplied to the mixing vessel 304. In some embodiments, vaporization point 303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 303 may be heat traced. In some examples, mixing vessel 304 may also be heat traced. In one non-limiting example, piping downstream of vaporization point 303 has an increasing temperature profile extending from approximately 100° C. to approximately 150° C. at mixing vessel 304.

In some embodiments, a solid precursor may be used. The solid precursor may be heated so that its vapor can be delivered to the chamber in a carrier gas stream or it may be vaporized in an upstream chamber or apparatus (not shown). In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure or flashing the liquid onto a heated surface. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 303. In one scenario, a liquid injector may be mounted directly to mixing vessel 304. In another scenario, a liquid injector may be mounted directly to showerhead 306.

In some embodiments, a liquid flow controller (LFC) upstream of vaporization point 303 may be provided for controlling a mass flow of liquid for vaporization and delivery to process station 300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 306 distributes process gases toward substrate 312. In the embodiment shown in FIG. 3, the substrate 312 is located beneath showerhead 306 and is shown resting on a pedestal 308. Showerhead 306 may have any suitable shape, and may have any suitable number and arrangement of ports for distributing process gases to substrate 312.

In some embodiments, pedestal 308 may be raised or lowered to expose substrate 312 to a volume between the substrate 312 and the showerhead 306. It will be appreciated that, in some embodiments, pedestal height may be adjusted programmatically by a suitable computer controller 350.

In another scenario, adjusting a height of pedestal 308 may allow a plasma density to be varied during plasma activation cycles included in the process. At the conclusion of the process phase, pedestal 308 may be lowered during another substrate transfer phase to allow removal of substrate 312 from pedestal 308.

In some embodiments, a position of showerhead 306 may be adjusted relative to pedestal 308 to vary a volume between the substrate 312 and the showerhead 306. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers 350. A computer controller 350 may include any of the features described below with respect to controller 450 of FIG. 4.

In some embodiments where plasma may be used as discussed above, showerhead 306 and pedestal 308 electrically communicate with a radio frequency (RF) power supply 314 and matching network 316 for powering a plasma. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are included above. Likewise, RF power supply 314 may provide RF power of any suitable frequency. In some embodiments, RF power supply 314 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 30 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 350 may be provided via input/output control (IOC) sequencing instructions. For example, the controller 350 may be configured to introduce a reducing agent and process gases for depositing a metal oxide to the process station 300. In some embodiments, the controller 350 may be configured to introduce a reducing agent such as hydrogen and ignite a plasma in the process station 300, purge the process station 300, introduce a magnesium-containing precursor, purge the process station 300, introduce an oxidant such as water vapor to the process station 300, and purge the process station 300.

In some embodiments, the chamber may include a sensor (not shown) with an in-situ metrology device and/or system (not shown) for analyzing the amount of oxide on the metal. In various embodiments, the metrology device may be capable of triggering introduction of a reducing agent to the chamber when the amount of oxide on the metal reaches a certain threshold. For example, the sensor may detect the amount of oxide, and the controller 350 may be configured to introduce a reducing agent to the process station 300 when the sensor detects a certain amount of a type of oxide on the surface of the substrate 312.

In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., a reducing agent), instructions for setting a flow rate of a carrier gas (such as nitrogen), and time delay instructions for the first recipe phase. A second, subsequent recipe phase may include instructions for introducing a flow of an inert and/or a reactant gas (e.g., a magnesium-containing precursor), instructions for introducing a flow of a carrier gas (such as nitrogen), and time delay instructions for the second recipe phase. A third, subsequent recipe phase may include instructions for modulating or stopping a flow of an inert and/or a reactant gas, and instructions for modulating a flow of a carrier or purge gas and time delay instructions for the third recipe phase. A fourth recipe phase may include instructions for modulating a flow of an oxidant such as water vapor, instructions for modulating the flow of a carrier or purge gas, and time delay instructions for the fourth recipe phase. A fifth subsequent recipe phase may include instructions for modulating or stopping a flow of an inert and/or a reactant gas, and instructions for modulating a flow of a carrier or purge gas and time delay instructions for the fifth recipe phase. In this example, introducing, modulating or stopping a flow of an inert, carrier or reactant gas may involve changing the gas flow rates or changing the state of gas delivery valves without changing the flow rates. In some embodiments, the reactant delivery system 301*a* may contain divert lines (not shown) and three-way valves that deliver the flow to either the chamber or the divert line which bypass the chamber. It will be appreciated that these recipe phases may be further subdivided and/or iterated in any suitable way within the scope of the present disclosure.

In some embodiments, pedestal 308 may be temperature controlled via heater 310. Further, in some embodiments, pressure control for process station 300 may be provided by throttle valve 318. As shown in the embodiment of FIG. 3, throttle valve 318 throttles conductance to a downstream vacuum pump (not shown). However, in some embodiments, pressure control of process station 300 may also be adjusted by varying a flow rate of one or more gases introduced to the process station 300. As described elsewhere herein, although an example in-situ plasma chamber is depicted in FIG. 3, in some embodiments, a remote plasma chamber with a remote plasma generator may be used. In some embodiments, an inductively-coupled plasma chamber may be used. In some embodiments, a plasma is not generated during various operations of disclosed embodiments.

One or more process stations may be included in a multi-station processing tool. An example of a multi-station processing tool is shown in FIG. 4. Note that although FIG. 4 shows one example of a multi-station processing tool suitable for performing various disclosed embodiments, in some embodiments a different multi-station processing tool may be used.

FIG. 4 shows a schematic view of an embodiment of a multi-station processing tool 400 with an inbound load lock 402 and an outbound load lock 404, either or both of which may include a remote plasma source (not shown). A robot 406, at atmospheric pressure, is configured to move wafers from a cassette loaded through a pod 408 into inbound load lock 402 via an atmospheric port 410. A wafer is placed by the robot 406 on a pedestal 412 in the inbound load lock 402, the atmospheric port 410 is closed, and the load lock is pumped down. Where the inbound load lock 402 includes a remote plasma source, the wafer may be exposed to a remote plasma treatment in the load lock prior to being introduced into a processing chamber 414. Further, the wafer also may be heated in the inbound load lock 402 as well, for example, to remove moisture and adsorbed gases. In some embodiments, the wafer may be exposed to a reducing agent in the inbound load lock 402 prior to transporting the wafer into a station within the chamber. The reducing agent used in this load lock 402 may be any of the reducing agents described herein except hydrogen plasma. Next, a chamber transport port 416 to processing chamber 414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 414 includes four process stations, numbered from 1 to 4 in the embodiment shown in FIG. 4. Each station has a heated pedestal (shown at 418 for station 1), and gas line inlets. It will be appreciated that in some embodiments, each process station may have different or multiple purposes. For example, in some embodiments, a process station may be switchable between an ALD and plasma-enhanced ALD (PEALD) process mode, where PEALD involves igniting a plasma when exposing the substrate to a second reactant such as an oxidant. Additionally or alternatively, in some embodiments, processing chamber 414 may include one or more matched pairs of ALD and plasma-enhanced ALD process stations. In some embodiments, one or more stations may be configured to perform CVD while one or more other stations in the same chamber are configured to perform ALD or PEALD. While the depicted processing chamber 414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 depicts an embodiment of a wafer handling system for transferring wafers within processing chamber 414. In some embodiments, wafer handling system may transfer wafers between various process stations and/or between a process station and a load lock. It will be appreciated that any suitable wafer handling system may be employed.

Non-limiting examples include wafer carousels and wafer handling robots. FIG. 4 also depicts an embodiment of a system controller 450 employed to control process conditions and hardware states of process tool 400. System controller 450 may include one or more memory devices 456, one or more mass storage devices 454, and one or more processors 452. Processor 452 may include a CPU or computer, analog, and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 458 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 400. System control software 458 may be configured in any suitable way. For example, various process tool component subroutines or control objects may be written to control operation of the process tool components used to carry out various process tool processes. System control software 458 may be coded in any suitable computer readable programming language.

In some embodiments, system control software 458 may include input/output control (IOC) sequencing instructions for controlling the various parameters described above. Other computer software and/or programs stored on mass storage device 454 and/or memory device 456 associated with system controller 450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 418 and to control the spacing between the substrate and other parts of process tool 400.

A process gas control program may include code for controlling gas composition (e.g., reducing agent gases, magnesium-containing gases, oxidant gases, carrier gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 450. The user interface may include a display screen, graphical software displays of the apparatus and/or process conditions, and user input devices such as pointing devices, keyboards, touch screens, microphones, etc.

In some embodiments, parameters adjusted by system controller 450 may relate to process conditions. Non-limiting examples include process gas composition and flow rates, temperature, pressure, plasma conditions (such as RF power levels), etc. These parameters may be provided to the user in the form of a recipe, which may be entered utilizing the user interface.

Signals for monitoring the process may be provided by analog and/or digital input connections of system controller 450 from various process tool sensors. The signals for controlling the process may be output on the analog and digital output connections of process tool 400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 450 may provide program instructions for implementing the above-described deposition processes. The program instructions may control a variety of process parameters, such as DC power level, RF power level, pressure, temperature, etc. The instructions may control the parameters to operate in-situ deposition of film stacks according to various embodiments described herein.

The system controller 450 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 450.

In some implementations, the system controller 450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 450, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 450, in some implementations, may be a part of or coupled to a computer that is integrated with, coupled to the system, otherwise networked to the system, or a combination thereof. For example, the system controller 450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 450 receives instructions in the form of data, which specify parameters for each of the processing steps to be performed during one or more operations. It should be understood that the parameters may be specific to the type of process to be performed and the type of tool that the system controller 450 is configured to interface with or control. Thus as described above, the system controller 450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of fabricating a layer for a magnetic device, the method comprising:
depositing a magnesium oxide film on a surface of a magnetic film by atomic layer deposition;
wherein the magnesium oxide film is deposited by exposing the magnetic film to alternating exposures of one or more magnesium-containing precursors selected from the group consisting of bis(ethylcyclopentadienyl) magnesium, bis(cyclopentadienyl) magnesium, bis(methylcyclopentadienyl) magnesium, bis(n-propyl-tetramethyl-cyclopentadienyl)magnesium, bis(pentamethylcyclopentadienyl)magnesium, bis(2,2,6,6-tetramethyl-3,5-heptanedionato) magnesium, magnesium β-diketonate, magnesium N,N-dimethylaminodiboronate, magnesium bis(di-secbutylacetamidinate), and combinations thereof, and an of oxidant in cycles; and
during the deposition of the magnesium oxide film, periodically exposing the magnetic film to a reducing agent comprising a hydrogen plasma that reduces oxide of the magnetic film at an interface on the magnetic film between the magnesium oxide film and the magnetic film while minimizing reduction of the deposited magnesium oxide film.

2. The method of claim 1, wherein each deposition cycle is substantially self-limiting.

3. The method of claim 1, wherein the magnetic film is exposed to the reducing agent at least partly when the magnetic film is exposed to the metal precursor.

4. The method of claim 1, wherein the magnesium oxide film is deposited to form a part of a magnetic tunnel junction.

5. The method of claim 1, wherein the magnesium oxide film is fabricated at a temperature less than about 400° C.

6. The method of claim 1, wherein the magnetic device comprising the magnesium oxide film has a tunnel magnetoresistance of at least about 200%.

7. The method of claim 1, wherein the magnetic film is exposed to the reducing agent before any magnesium oxide is deposited.

8. The method of claim 1, wherein the magnesium oxide film is deposited to a thickness less than about 20 nm.

9. The method of claim 1, wherein the magnetic film is selected from the group consisting of a cobalt iron, cobalt iron boron, nickel iron, cobalt palladium, and combinations thereof.

* * * * *